United States Patent [19]
Gendlin

[11] Patent Number: 5,841,689
[45] Date of Patent: Nov. 24, 1998

[54] NON-VOLATILE RECORD CARRIER WITH MAGNETIC QUANTUM-OPTICAL READING EFFECT AND METHOD FOR ITS MANUFACTURE

[76] Inventor: Shimon Gendlin, 21 Reed La., Westbury, N.Y. 11590

[21] Appl. No.: 758,096

[22] Filed: Nov. 29, 1996

[51] Int. Cl.⁶ .................................................. H01L 43/08
[52] U.S. Cl. ........................................... 365/145; 235/454
[58] Field of Search ............................. 365/145; 235/454

[56] References Cited

U.S. PATENT DOCUMENTS

| | | | |
|---|---|---|---|
| 5,390,142 | 2/1995 | Gendlin | 365/145 |
| 5,524,092 | 6/1996 | Park | 365/145 |

*Primary Examiner*—Harold Pitts
*Attorney, Agent, or Firm*—Lott & Friedland

[57] ABSTRACT

A composition of materials (record carrier) with ferromagnetic and quantum-optical properties has been discovered, which can be used as an environment for accumulation with high-density recording of discrete information. In the preferred version, the composition of materials of record carrier (100,110,120,140,160,170 and 180) comprises a first amorphous layer of $Ni_{(1-x-y)}Fe_xMo_y$, a second polycrystalline layer of $Co_{(1-z-w)}Nb_zV_w$, and a third polycrystalline layer of $Co_{(1-j)}Nb_j$, where x, y, z, w and j are values preferably within the ranges of $0.11 < x < 0.13$; $0.075 < y < 0.085$; $0.145 < z < 0.155$; $0.095 < w < 0.105$. Additionally, the layers also contain the following elements: Si, O, Ar, N, I. A random-access, non-volatile memory cell built using the invented composition of materials (record carrier) has also been discovered and a new non-volatile memory cell has been discovered, where, while information is read, a magnetic quantum-optical effect is used. This effect, based on the recently discovered magnetic quantum-optical phenomenon in silicone, is entitled after the name of its discoverer "Gendlin Effect". Each cell comprises two orthogonal address lines formed on both sides of a polycrystalline layer $Co_{(1-j)}Nb_j$; above each address line (130 and 150) there are layers in the following sequence: $Co_{(1-z-w)}Nb_zV_w$, $Ni_{(1-x-y)}Fe_x Mo_y$, porous p-Si and semiconductor light detector. Data are stored electro-magnetically and retrieved in the form of a quantum of light.

90 Claims, 8 Drawing Sheets

NON-VOLATILE RECORD CARRIER WITH MAGNETIC QUANTUM-OPTICAL READING EFFECT AND METHOD FOR ITS MANUFACTURE

BACKGROUND OF THE INVENTION

Computer technology requires memories having high speed and a large storage capacity. Typically, in a modem computer, a semiconductor memory is employed as high-speed primary memory and magnetic disks are used for a large-volume secondary memory.

Meanwhile, the new computer developments require that the memory of the primary level were non-volatile, had access speed at any address of a few nanoseconds and had the capacity of no less than one gigabyte. Obviously, the availability of such memory will simplify not only circuits of computers (as there will be an opportunity to lose a DISK OPERATING SYSTEM, which is far from being optimal and which the majority of computers use today), but will allow to create their dramatically new design.

Currently there is not one non-volatile memory chip in existence that could be used as memory of primary level in a modern computer, thus replacing DRAM chips, since all existing non-volatile devices cannot compete with DRAM in operating speed, in density of stored information per unit of volume in a single chip, nor in cost per megabyte. The latter is very important, since the industry cannot quickly turn to new technologies if currently used materials in existing technologies have to be radically replaced, i.e. to change the general technological cycle in DRAM-producing enterprises, for example. This would incur tremendous expenses that would not be realistic today.

Thus, there is a present need for developing a non-volatile, high-speed, high-capacity, random-access, static and updatable storage system using modern technology and can be produced at existing facilities. These specific requirements are met by this invention, based on the newly discovered effect (magnetic quantum-optical effect in polycrystalline silicon, named after its discoverer, "Gendlin Effect"), that not only differs in its novelty, but will also allow today to create a technological process that will quickly, without major expense, allow enterprises that use technologies such as 0.25–0.4 $\mu$m for DRAM to manufacture a dramatically new product.

SUMMARY OF THE INVENTION

This invention concerns a new non-volatile memory cell where, during the reading of information, a magnetic quantum-optical method is used. This method is based on the recently discovered magnetic quantum-optical effect, named after its discoverer, "Gendlin Effect". This invention also deals with a new composition of materials for non-volatile carrier that could be used as an environment of accumulation with high-density recording of discrete information; it also concerns a non-volatile storing device with random access, built with the use of a new composition of materials and new memory cell.

Thin metal magnetic films with high specific resistance to electric current with various crystal structures are used as the record carrier.

More definitely, this concerns the new magnetic record carrier on thin films with high specific resistance to electricity, deposited from both sides in a thin film-base conductive electrode made from non-magnetic metal with low specific resistance to electric current, which is the source of an electromagnetic field when electric current passes through it, and are packed in porous silicon, whose caverns are filled with the magnetic material of the carrier.

When electric current is sent through the electrode, a magnetic field is generated around it, directed through all layers of thin magnetic films and adjoining areas of porous silicon, whose caverns are filled with the magnetic material of the carrier from the layer next to the porous silicon and thus magnetizes or changes the direction of the magnetic field inside the magnetic carrier. Meanwhile, the magnetic domains of the carrier located between small-sized "hairs" (less than 2.5 nm) in porous silicon, generate resilient mechanical pressure on them (compression and expansion). As a result, the "hairs" are deformed and, according to the principles of quantum mechanics, the energy state changes as the position of electrons is localized, and a quantum of light is generated in the bordering zone of this interaction. (Gendlin Effect, described in detail in the discovery application entitled "Magnetic quantum-optical effect in polycrystalline silicon"). This quantum of light is used to define the characteristics of the carrier concerning its magnetic reversal (signal of reading), that has found its implementation in the real device.

Gold can be used as a non-magnetic material, or aluminum or other non-magnetic material with low specific resistance to electricity, choice here depending on economic reasons. However, it is necessary to note that use Ag is not advisable.

To improve residual magnetic field, orientation, speed of magnetization and surface smoothness, the record carrier includes layers of $Ni_{(1-x-y)}$ $Fe_x$ $Mo_y$, $Co_{(1-z-w)}Nb_z$ $V_w$, $Co_{(1-j)}Nb_j$, where x, y, z, w, j stand for the proportion of elements in their appropriate layers. It is preferable that these figures were within the following ranges:

$0.11 \leq x \leq 0.13$; $0.075 \leq y \leq 0.085$; $0.145 \leq z \leq 0.155$; $0.095 \leq w \leq 0.105$; $0.18 \leq j \leq 0.21$.

In the preferred composition, the layers also contain the following elements: Si, O, Ar, N, I. These elements are introduced by way of chemical plasma deposition from a steam phase (PECVD), and ion implantation.

In the memory device of this invention, two sets of parallel address lines are located orthogonally on the opposite sides of the layer $Co_{(j-j)}Nb_j$, and the layers $Ni_{(1-x-y)}Fe_x$ $Mo_y$, $Co_{(1-z-w)}Nb_zV_w$ are generated on both sides of address lines, while the layers $Co_{(1-z-w)}$ $Nb_zV_w$ are connected to an electrode. The layers, connected to an electrode of address lines, are polycrystalline, and the outside ones are amorphous, reducing the magnetic influence on the adjacent magnetic record cells located close to them and improve the orientation of magnetic dipoles in neighboring zones in porous silicon.

An individual memory cell is located at each crossing point of the address lines.

By applying appropriate current pulses to the two address lines, two independent bits of information can be magnetically stored in a single memory cell. This information is retrieved as a quantum of light, which is generated in silicon when orientation magnetic dipoles is changed. This light is caught by semi-conductor detectors located on top and on bottom of all layers (on silicon), which layers will transform the quantum of light into electrical reading signals.

More specifically, in order to store and retrieve the first bit of information in a memory cell, two synchronized current pulses with the same amplitude and polarity are applied to two orthogonal address lines.

The next bit is stored and retrieved in that memory cell by applying two synchronized pulses of the same amplitude but of opposite polarity to the same two address lines. The current pulses used for storing binary information are such that the amplitude of a single pulse is not sufficient to alter the status of stored information, but that two concurrent pulses are enough for storing data.

Such a memory cell is non-volatile, random-access, static, operated at high speed, requires low power, is readable and recordable, and can be made in high density arrays. In the preferred implementation of the invention, a silicon crystal with the external sizes (16×8×0.14 mm) is used or (0.62"× 0.31"×0.0055"), where the whole interface is located and represents a complete non-volatile direct-access device on one category with 67,108,864 addresses (67 Mbit). Standard packaging for (20×10×2.6) mm or (0.78"×0.39"×0.1") chips accommodates completed memory for 8 categories with 134,217,728 address (1,073,741,824 Mbit) at the speed of access to any address (information update time) in 12 ns.

BRIEF DESCRIPTION

These and other objectives, features and advantages of this invention are set forth in more detail in the accompanying Detailed Description, where:

Figure 5A:
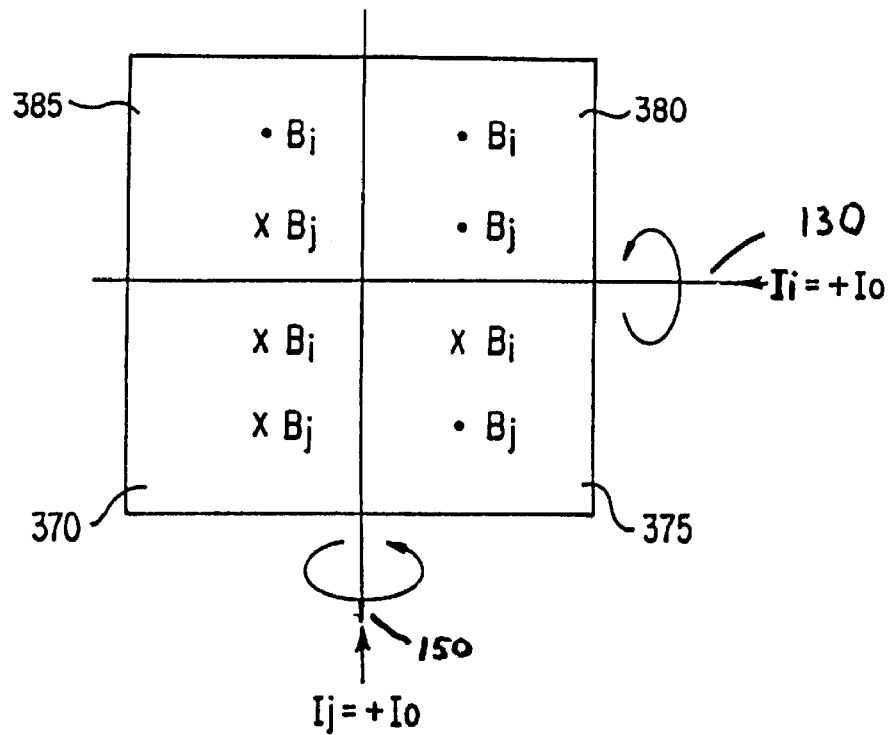
Figure 6A:
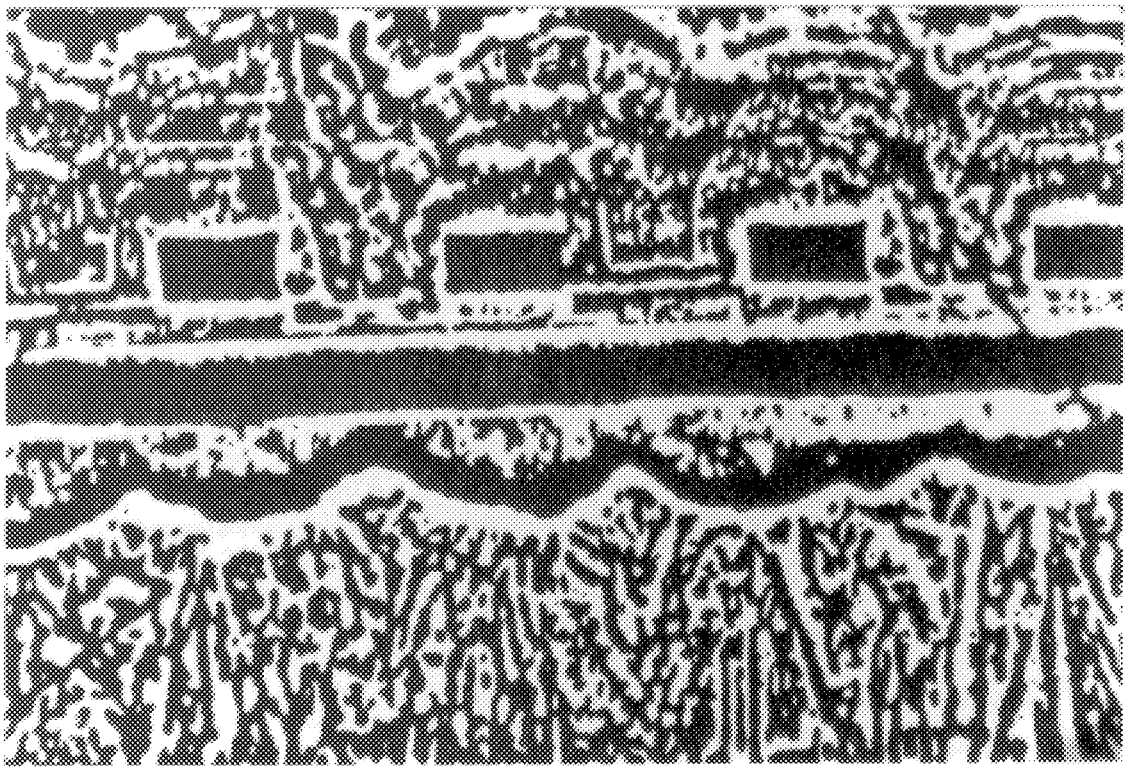
Figure 6B:
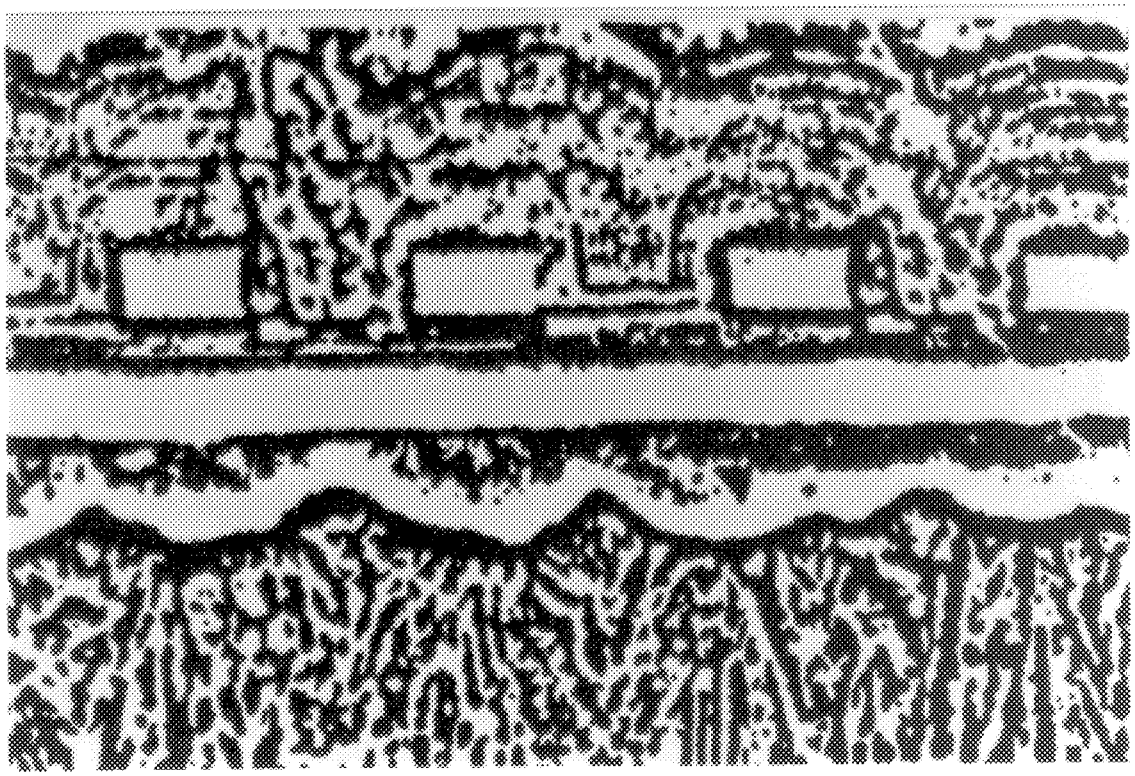
Figure 7A:
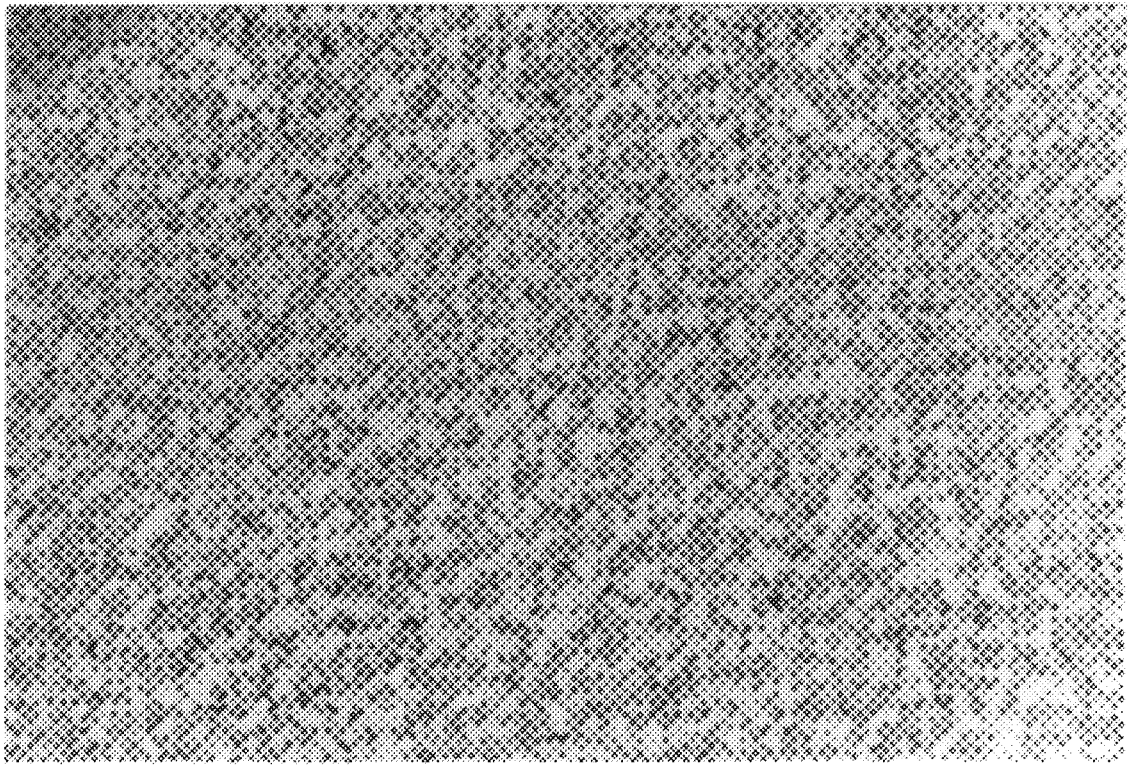
Figure 7B:
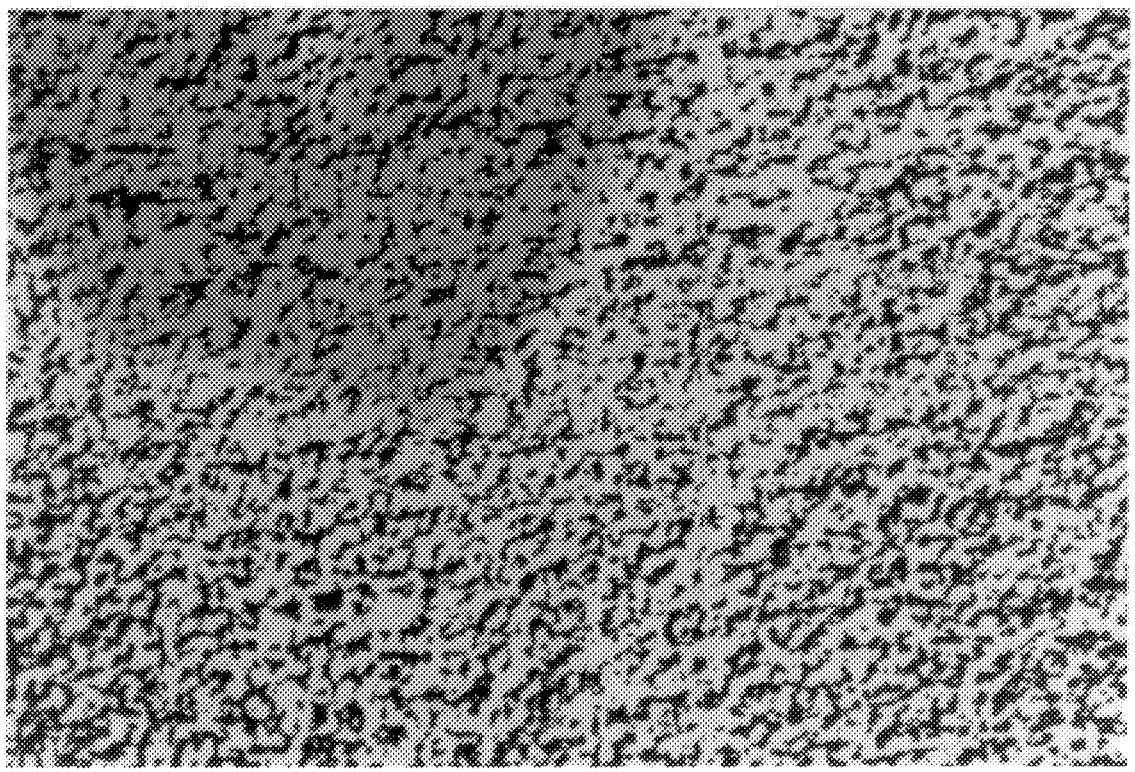

FIGS. 4(a),(b),(c) and (d) show the sizes of the silicon basis on which the storing device is located;

FIGS. 5(a), (b) and (c) illustrate the process of selecting record carriers within the memory device;

FIGS. 6(a) and (b) show microphotographs of cross-section of preferred version of the storing device (positive and negative images);

FIGS. 7(a) and (b) show microphotographs of a ferromagnetic layer on the surface of the basis (negative and positive images);

DETAILED DESCRIPTION

This invention deals with a new non-volatile memory cell, where, while information is retrieved, a magnetic quantum-optics method is used, based on the recently discovered magnetic quantum-optics effect named after its author "Gendlin Effect". This invention also covers new compositions of materials for a non-volatile carrier that can be used as the accumulation environment with high-density recording of discrete information, and also deals with a non-volatile storing device with direct access, constructed using a new composition of materials and a new memory cell.

As the record carrier, a thin magnetic film is used with high specific resistance to electricity, located on both sides on a thin filmy conducting electrode (trunk) made from magnetic metal with low specific resistance to electricity, which film is the source of an electromagnetic field when current is sent through it, packed in porous silicon. When current is sent through the electrode, a magnetic field is generated around it, which is directed through all layers of thin magnetic films and adjacent porous silicon areas, whose pores are filled with the material of the carrier, thus magnetizing or changing the direction of the magnetic field within the magnetic. If the residual magnetic field within the magnetic carrier is not consistent with the direction of the external magnetic field affecting it, coming from the source of the magnetic field, we have a magnetic reversal of the latter, and its domains create resilient mechanical pressure (compression and expansion) on small "hairs" (less than 2.5 nm) that are in the porous silicon, which "hairs" surround the domains. As a result, the "hairs" are deformed and, according to the principles of quantum mechanics, the energy state is changed when the position of electrons is localized, and in neighboring zone of this interaction a quantum of light is generated (Gendlin Effect). This quantum of light is used to define the characteristics of the carrier concerning its magnetic reversal (signal of reading), which was implemented in the real device. In this device, light is caught by semi-conductor detectors located on top and on bottom of all layers (on silicon), which layers will transform the quantum of light into electrical signals of reading.

Figure 1A:
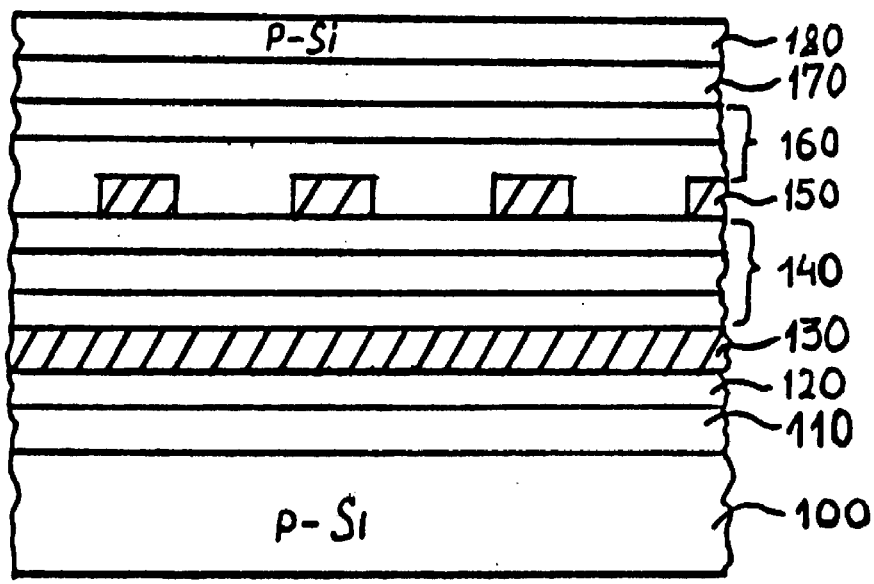
FIG. 1(a) shows the cross-section of a preferred version of the composition of materials of this invention.
Figure 1B:
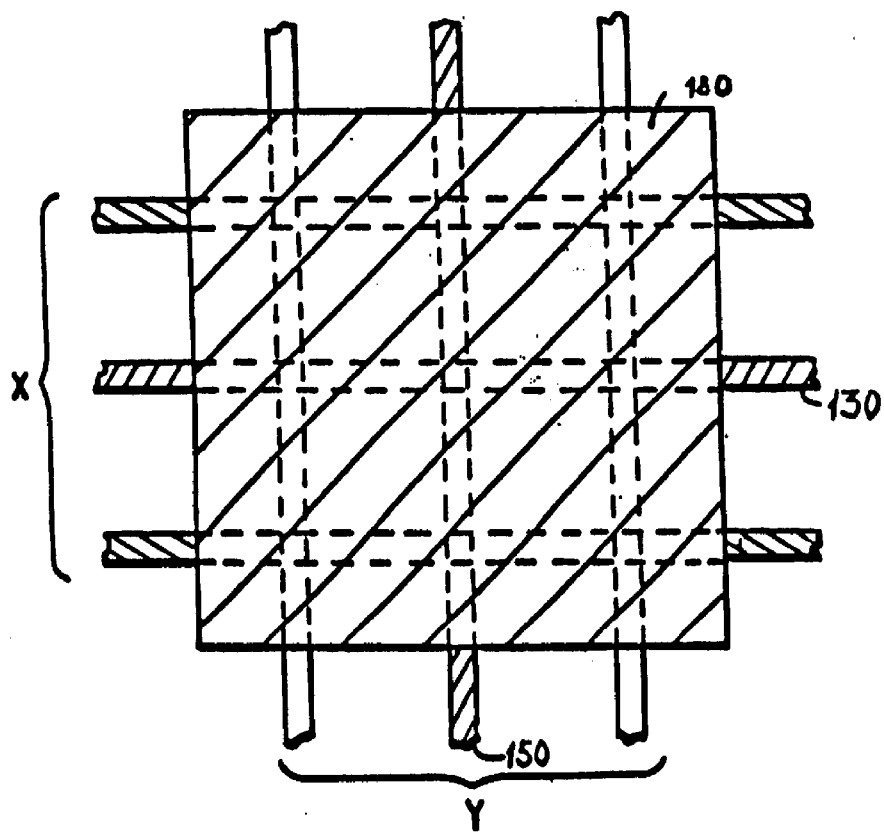
FIG. 1(b) shows the address lines (view from top)

FIG. 1 shows this in more detail, where you can see that in the preferred version of the invention, two sets of parallel address lines made from aluminum of 0.4 $\mu$m wide and 0.15 $\mu$m 130,150 thick, located orthogonally on opposite sides of the flat layer 140, are used as the source of a magnetic field. On the external sides of address trunks, layers are located in the following sequence: 120,110 and 160,170. The cell of the individual storing device is at each cross-point address lines. All this is packed inside a silicon crystal, whose internal walls are transformed by electrochemical pickling HF into porous silicon, whose caverns are passivitized with iodine.

To improve residual magnetic fields, orientation, speed of magnetization and surface smoothness, the record carrier includes the layers $Ni_{(1-x-y)}Fe_xMo_y$, $Co_{(1-z-w)}Nb_zV_w$, $Co_{(1-j)}Nb_j$, where x, y, z, w, j show a proportion of elements in their respective layers. Preferably, these sizes must be within the following ranges:

$0.11 \leq x \leq 0.13$; $0.075 \leq y \leq 0.085$; $0.145 \leq z \leq 0.155$; $0.095 \leq w \leq 0.105$; $0.18 \leq j \leq 0.21$.

In the preferred version, the layers also contain the following elements: Si, O, Ar, N, I. These elements are entered by way of chemical plasma deposition from the steam phase (PECVD), and by way of ion implantation.

The layers 120,160 consist of films $Co_{(1-z-w)}Nb_zV_w$ 0.2 $\mu$m thick. These layers have a polycrystalline structure, rectangular loop of hysteresis, and are connected to an electrode of address lines.

The layers 110,170 consist of films $Ni_{(1-x-y)}Fe_xMo_y$ 80 nm thick—these layers are amorphous and have similar surfaces as opposed to polycrystalline films, in which various crystal irregularities are there on the surface of a film. These layers have low coercive force, high magnetic transparency. Layer 140 consists of a $SiO_2$ film 50 nm thick, on which a layer $Co_{(1-j)}Nb_j$ 100 nm thick is deposed, which essentially fills in intervals between adjacent address lines.

In the memory device of this invention, two sets of parallel address lines are located orthogonally on opposite sides of a $Co_{(1-j)}Ni_j$ layer, and the layers $Ni_{(1-x-y)}Fe_xMo_y$, $Co_{(1-z-w)}Nb_zV_w$ are generated on both sides of address lines, and the layers connected to an electrode of address lines, are polycrystallic, and the outside one are amorphous, which reduce the magnetic influence to adjacent magnetic record cells close to them and facilitate orientation of magnetic dipoles in adjacent zones in porous silicon.

Physical properties of the invented carrier of record are described below. Understanding of these properties will help to understand the operation of the memory device using this record carrier.

By way of background, a ferromagnetic material exhibits a permanent magnetic field in the absence of an external magnetic field. Such materials can be described in terms of a large number of small magnets known as magnetic dipoles. An external magnetic field applied to a ferromagnetic material aligns the magnetic dipoles within the material in the direction of the applied field, so that the total magnetic field within the material is the sum of the external field and the field generated by the aligned magnetic dipoles. When the influence of an external magnetic field is discontinued, the orientation of magnetic dipoles does not change, resulting in a constant magnetic field in the material. Magnetic information storage is based on this property of ferromagnetic materials.

Figure 2:
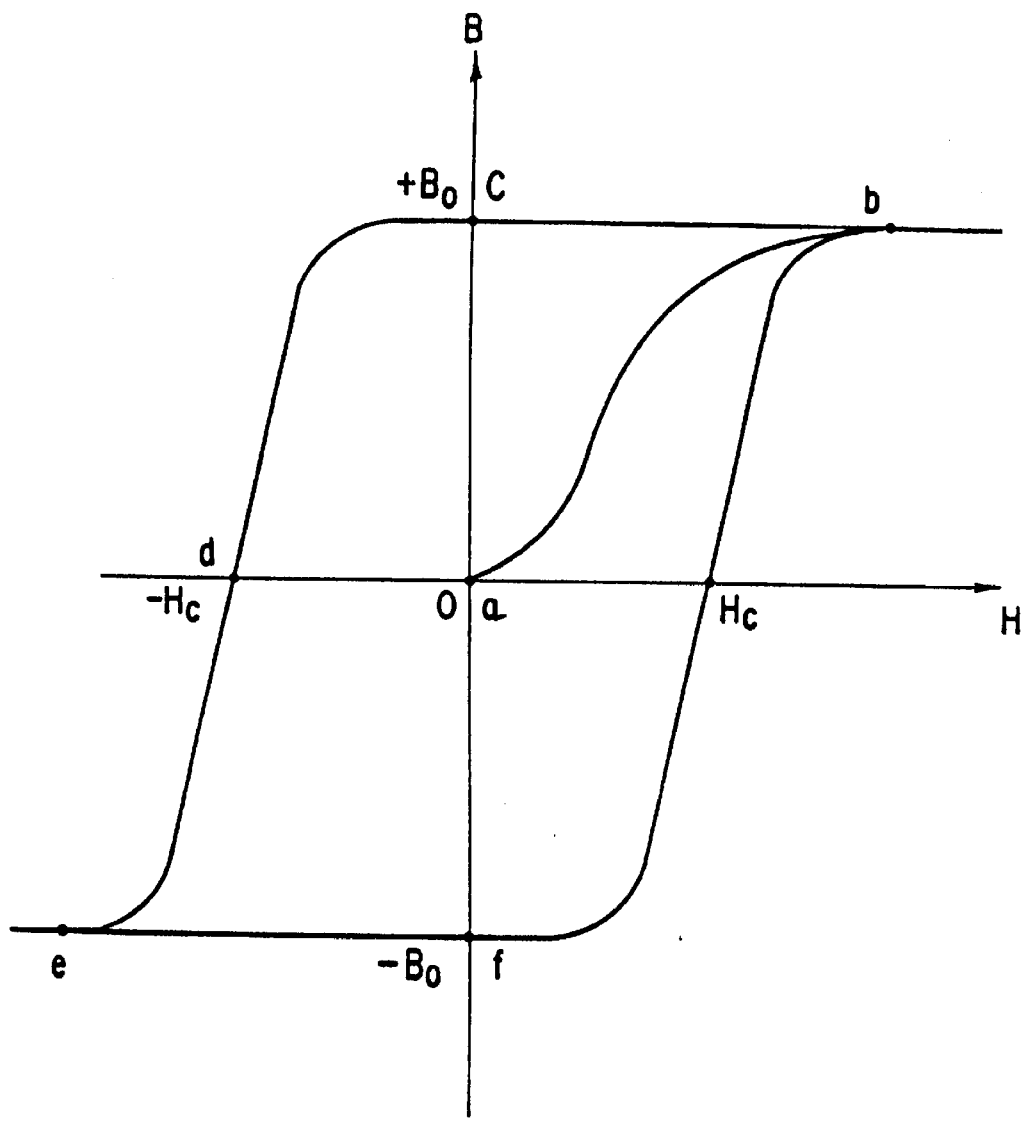
FIG. 2 shows the magnetization curve (BH loop) of a conventional ferromagnetic material.

FIG. 2 shows an exemplary magnetization curve of a typical ferromagnetic material. The magnetization curve is also referred to as a BH loop. The Y axis in this figure represents magnetic induction B, which is an overall magnetic field in the material, and the X axis represents the magnetic field strength H of the external magnetic field. Thus, the BH loop shows the change in the magnetic induction B with changing magnetic field strength H.

Let us consider the BH loop of FIG. 2 in further detail. Assuming that initially the orientations of magnetic dipoles of the ferromagnetic material are evenly distributed in all directions, the total value of B in the absence of the external field is zero (point "a" on the curve). When an external magnetic field is applied to the ferromagnetic material, the value of B gradually increases as H increases until it reaches a point where magnetic induction B begins to saturate (point "b" on the curve). In other words, when H reaches a certain value, B remains substantially at $B_0$ even if H is being increased If, after saturation, the external magnetic field is decreased to H=0, magnetic field induction B does not return to the point "a" (B=0). Instead, the value of B remains approximately at $B=B_0$ (point "c" on the curve).

At point "c" the direction of the external magnetic field H is reversed. At approximately $H=-H_0$, the external field H changes the polarity of the field B, and, at point "e", the field saturates at the opposite polarity $B=-B_0$.

Increasing the field strength H causes B to change from point "e" on the curve to point "f" and then "b", as illustrated in FIG. 2.

Figure 3:
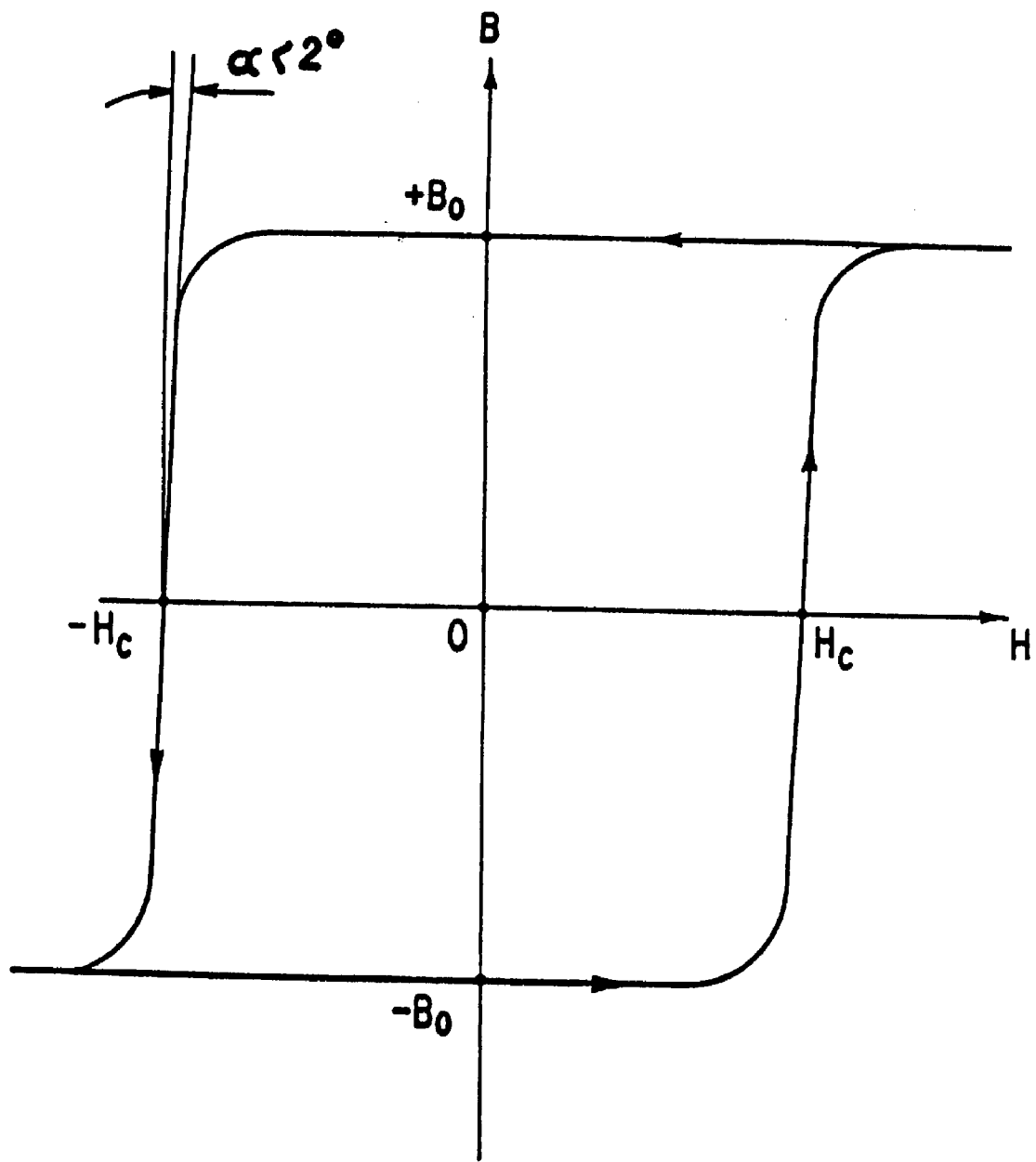
FIG. 3 shows a square-shaped BH loop of the composition of materials of this invention.

FIG. 3 illustrated the BH loop of the carrier of record of the present invention. As in FIG. 2, the X axis indicates the external field strength H and the Y axis indicates the magnetic induction B. It is important to note that for the invented carrier of record, the shape of the BH loop is substantially square with angle a between the Y axis and the BH loop at B=0 being approximately 2°. Because the magnetization curve is substantially square, the magnetic induction B is almost invariably at one of the two discrete, stable states, namely $+B_0$ and $-B_0$. Accordingly, the novel carrier of record is suitable for storing binary information.

When the ferromagnetic material (or, more exactly, thin ferromagnetic films) is in right next to the porous silicon, affected by the external magnetic field crossing all layers of the films, the direction of the magnetic field in the ferromagnetic material changes, for example, from $+B_0$ to $-B_0$, and in the porous silicon a quantum of light is emitted as result of a change of orientation of magnetic dipoles in the ferromagnetic layers, and their effect on thin "wires" (less than 1.5 nm), that are in the porous silicon. This quantum of light can be used to define the characteristics of the ferromagnetic material concerning its magnetic reversal (signal of reading), implemented in the real device, which is the subject of this invention.

Regular silicon will not radiate light because there is a forbidden power zone. Porous silicon, located in right next to the magnetic material emits visible light, which is generated by the change of orientation of magnetic domains in this material from external electromagnetic field. One of the explanations of this phenomenon is that the forbidden power zone is increased and displaced, when electrons are limited by small "wires" formed at the pickling of silicon, and re-orientation of magnetic domains located right next to them renders compressing and expanding effect (according to principles of quantum mechanics, the energy state changes when the position of electrons is localized). This produces blue light that fades out 0.5 ns after the completion of magnetic reversal of domains.

The manufacturing of the storing device begins with a substrate, which is a monocrystallic Si plate, where:

Surface orientation (100);

Type of conductivity P (boron-alloyed);

Specific resistance 12 Ω/cm;

Concentration of oxygen<$1\times10^{18}$ atom/cm$^3$;

Concentration of carbon<$5\times10^{16}$ atom/cm$^3$;

Thickness $1.4\times10^3$ μm, length $1.6\times10^4$ μm, and width $8\times10^3$ μm.

Figure 4:
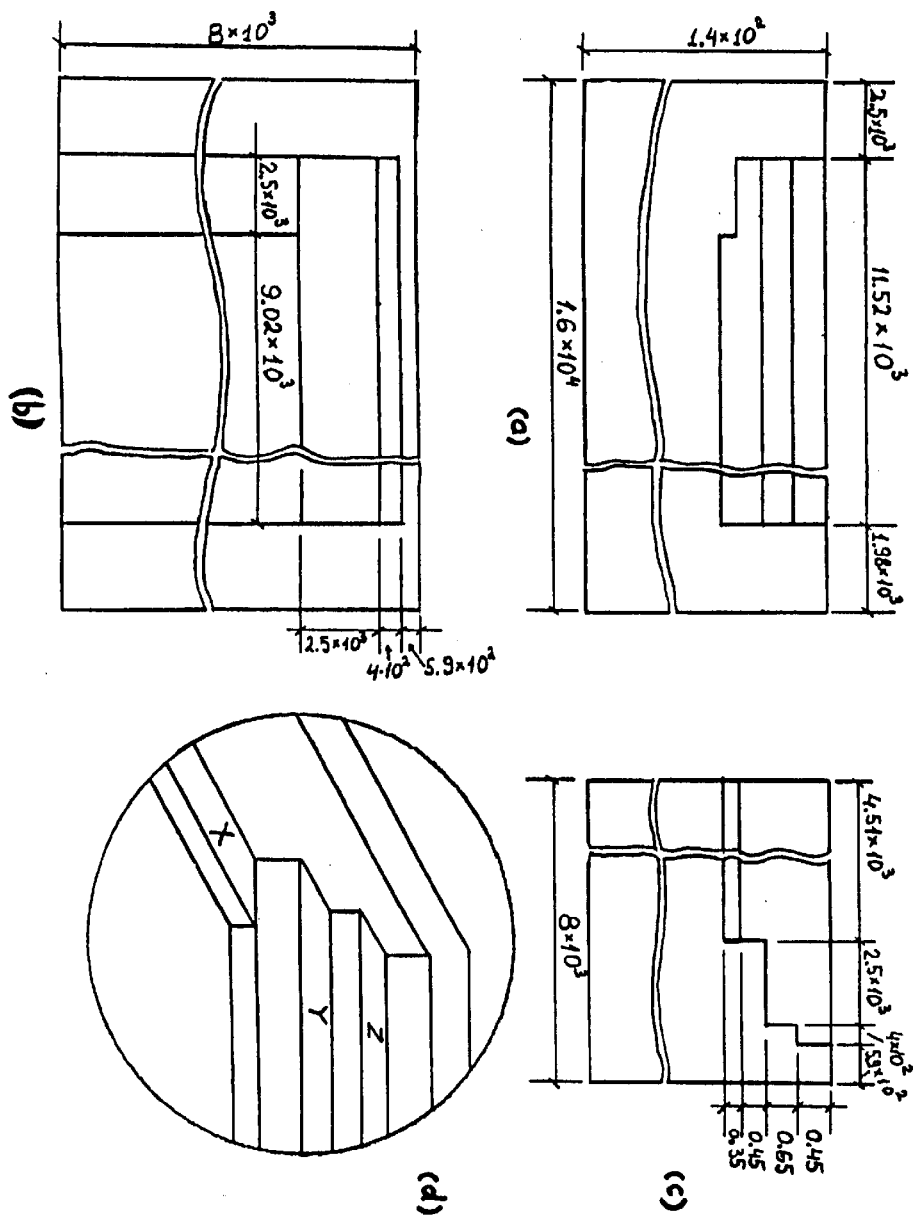

In a substrate, a $1.152\times10^4$ μm long, $7.41\times10^3$ μm wide and 1.5 μm deep platform is etched by a solution HF (FIG. 4), and peripheral sites are masked. As seen in FIG. 4d, the basis of a platform has a "ladder" geometry with several levels.

The next operation is the implantation in the porous surface (formed as a result of etching HF) of iodine basis for the improvement of optical properties. The porous silicon structure facilitates the iodine diffusion into the caverns of a film.

The iodine diffusion into the caverns of a film occurs in the air-tight chamber at $2\times10^{-6}$ Torr and the vapor pressure at ($I_{127}$) in $5\times10^{-3}$ Torr at the temperature of 150° C. within 60 seconds.

The next stage of the process is placing amorphous film 110 on the bottom level of the silicon basis. An amorphous magnetic layer with low coercive force and high magnetic transparency (catalytic layer) can be formed by sputtering or vacuum deposition with cooling of the substrate or chemical evaporation from the vapor phase (CVD—chemical vapor Deposition). Amorphous magnetic layers can be obtained in a different way, too, i.e. first forming a polycrystalline magnetic film, in which an ion Ar, +N is implanted.

The number of introduced ions can be $10^{12}$–$10^{16}$ to a square centimeter in the accelerating voltage from 45 up to 60 kV.

To get amorphous film in the real memory device, a way of obtaining amorphous film was used from polycrystalline Permalloy film, implanting in it $1\times10^{14}$ N$_2$+ions per square centimeter in the accelerating voltage of 50 kV. After the implantation of ions, the film was tested by electronic diffraction in order to find that the surface layer of the film has amorphous structure. Before this process, all areas around "the working windows" $9.02\times10^3$ μm long and $4.51\times10^3$ μm in wide, where films are deposited, are temporarily masked. The silicon substrate is placed on a holder and is put inside the vacuum chamber with at $2\times10^{-6}$ Torr. Argon is under the compression of $5\times10^{-3}$ Torr. The substrate is heated to 100° C. The alloy (Ni:Fe:Mo), in the ratio of weight parts (80:12:8) is sputtered in the course of 2 minutes at 200 W, forming a film 80 nm thick. Then the resulting film is implanted with ions $1\times10^{14}$ N$_2$+ per square centimeter at an accelerating voltage of 50 kV. The energy of the process of introduction of an ion destroys crystalline ties with the surface layer of the film, creating amorphitization. Directly on the catalytic layer 110, a layer of registration 120 is deposited. An alloy (Co:Nb:V), in the ratio of weight parts (75:15:10) is sputtered in the course of 6 minutes at 200 W under the same conditions as at the formation of the catalytic layer, forming a film 0.2 mm thick. This film has a polycrystalline structure.

The next operation is metallization of the surface of the layer 120 with aluminum and formation of address lines (X-line). Before plating the aluminum, a usual for aluminum barrier layer from (Ti) or (TiN) is plated to reduce the chance of metal diffusion, which is deposited, or by chemical deposition from the vapor phase (CVD), or by reactive diffusion. As an alternative, we can use other magnetic materials with low specific resistance. It is necessary to note that during this operation an aluminum layer pulverized on first step, too (platform X, see FIG. 4d), which is previously stripped of the masking layer and on which contact platforms are formed for connection with the semi-conductor control circuit lines X. Aluminum can be deposited by way of chemical deposition from the vapor phase, or by physical deposition using plasma. It is also possible to use deposition with the help of laser, although its application is usually limited to the formation of local areas of metal for the purposes of repairs. A drawing is then etched upon the deposited aluminum layer, which is etched to form a series of aluminum strips (in the preferred version of the device X=by 8192) 0.15 μm thick, each of which is 0.4 μm wide and are at the distance of 0.7 μm from each other. Preferably, after this operation, the aluminum layer outside rectangle containing strips should remained unetched, so that the ends of all the strips (X) were connected in this peripheral region and protrude to be connected to the common wire of the semiconductor control circuit. You can place the drawing on the aluminum with the help of halogen plasma on the basis of chlorine, for example, $CL_2/BCL_3$, which is very effective when pickling aluminum.

Before depositing the layer 140, step (platform-X, FIG. 4d) is masked again.

The silicon dioxide for the layer 140 is formed by the process PECVD (chemical plasma deposition from the vapor phase) from:

TEOS, $SiH_4+O_2$(400° C.), or TEOS+$O_3$(400° C.).

The freshly deposited film from silicon dioxide is amorphous and contains a series of polyanders with an open structure. This film is 50 nm thick and fills up the whole area both above the aluminium lines and intervals between them. On this film, an alloy (Co:Nb) is deposited in the ratio of weight parts (80:20). This alloy is sputtered under the same conditions as the layer of registration 110, but in the course of 4 minutes at 300 W, and fills in intervals between address lines X to the depth of their thickness.

After the deposition (Co, Nb,) the silicon dioxide is deposited from above again, which fills in irregularities until the formation of an even and smooth surface.

After this process, upper address lines Y are formed. It is necessary to note that during this operation an aluminium layer sprayed on the second step, too (platform-Y, see FIG. 4d), which is previously stripped of the masking layer, and on which contact platforms for connection with the semi-conductor control circuit Y-ranges are formed. On the deposited aluminum, a drawing is then put which is etched to form a series of aluminum strips (in the preferred version of the device Y=4096) 0.15 μm thick, each of which is 0.4 um wide, at the distance of 0.7 um from each other. Preferably, after this operation the aluminum layer outside the rectangle, which contains the strips, should remain untreated so that the ends of all strips (Y) would be connected in this peripheral area, and protruded for connection with the common wire of the semiconductor control circuit. Before depositing the next layer of registration 160, a step (platform Y, FIG. 4d) is masked again.

The next stage of the process is deposition of the layer 160. This layer is deposed in intervals between aluminum lines of the ranges (Y) and on the lines themselves. The thickness of this layer is 0.2 μm, but its surface is irregular because of the difference in the basis structure where it is deposed. The process spraying of this layer is the same as that of the layer of registration 120. After spraying of this layer, a layer of silicon dioxide is deposited on it to fill up the irregularities, and to get even, smooth surface.

Layer 170 is deposited in the same way as layer 110.

After the deposition of the top layer 170, layer 180 (p-Si) 0.3 μm thick is deposed, which is etched to the depth of 0.2 μm HF to form internal porous structure.

In the privileged device, a process of obtaining polycrystalline silicon from amorphous silicon is used. For this purpose, a powerful eximer laser is used on XeCl, which completely melts amorphous polysilicon within 40 ns, which allows us to recrystallize it as polycrystalline silicon without overheating the substrate. A homogenous laser beam scans the substrate, periodically melting and recrystallizing a silicon layer in order to get a homogenous film (p-Si). Amorphous silicon is put at 350° C. on the amorphous ferromagnetic layer 170.

The next operation is passivitizing of the caverns of porous silicon with iodine, as was done for the bottom basis of a silicon substrate. After this process ($I_{127}$) penetrates almost through all the depth of the silicon, up to the layer 170.

The process of formation of the record storage is concluded by pasting on p-Si of a thin plate 25 μm, on which a photo-sensitive layer is put and which represents the light radiation detector. On the bottom surface of the basis of a silicon substrate, a platform 25 μm deep is also etched, on which a second plate with the detector of light is placed. This groove should preferably be etched until the completion of the whole process of formation of the memory device, to avoid undesirable internal pressure in a silicon substrate, which can arise while forming the semiconductor control circuit located on this silicon basis. Pins of the semiconductor control circuit are on the steps X and Y on silicon crystal, where the inputs of address lines are located. The process of formation of the semiconductor control circuit presents the usual CMOS process and goes on simultaneously with the manufacturing of the record storage. As it is not the subject of this invention, it is not considered in this application. Thus, a new two-dimensional memory array has been manufactured. The area near each intersection of the orthogonal address lines 130,150 constitutes a cell of the memory.

More specifically, as shown in FIGS. 1(a) and (b), the set of metal strips on the lower surface of the layer 140 forms a first set of addressing lines 130, (referred to as X lines), and the set of metal strips on the upper surface of the layer forms a second set of addressing lines 150 (referred to as Y lines). When two electrical currents $I_i$ and $I_j$ are simultaneously applied to a given line $X_i$ of the X lines and a line $Y_j$ of the Y lines, respectively, a memory device (i,j) at the intersection of $X_i$ and $Y_j$ is selected. By properly choosing the magnitudes and polarities of the currents $I_i$ and $I_j$, information can be stored or retrieved from the memory device (i,j). Thus, the memory array, comprising the memory devices of the present invention, is random accessible.

Figure 5B:
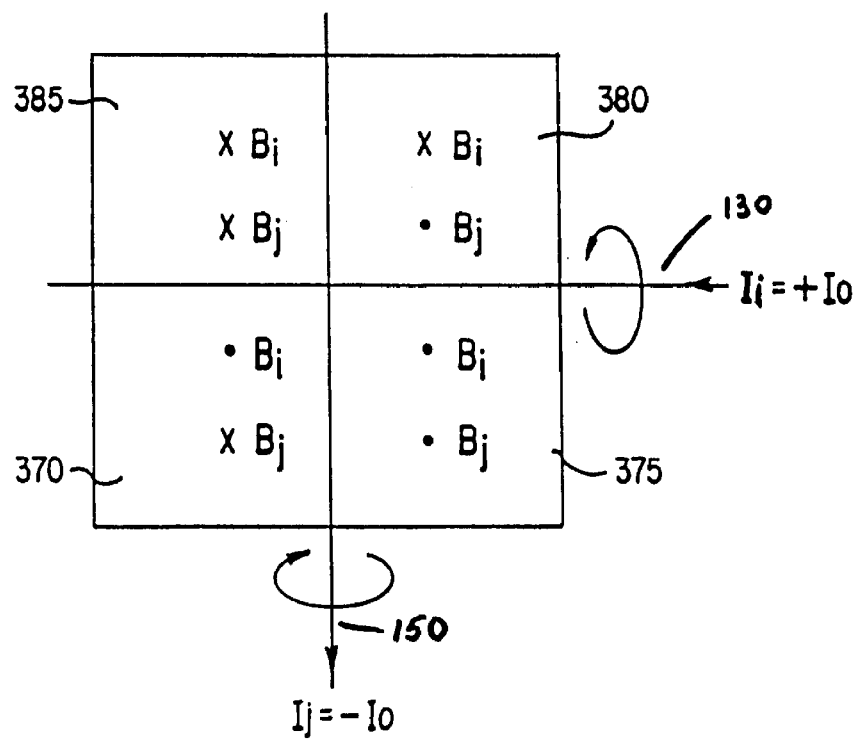

The process of storing information in a cell will be apparent from FIGS. 5(a), 5(b). FIGS. 5(a) and (b), show top views of a single cell of the memory device.

Figure 5C:
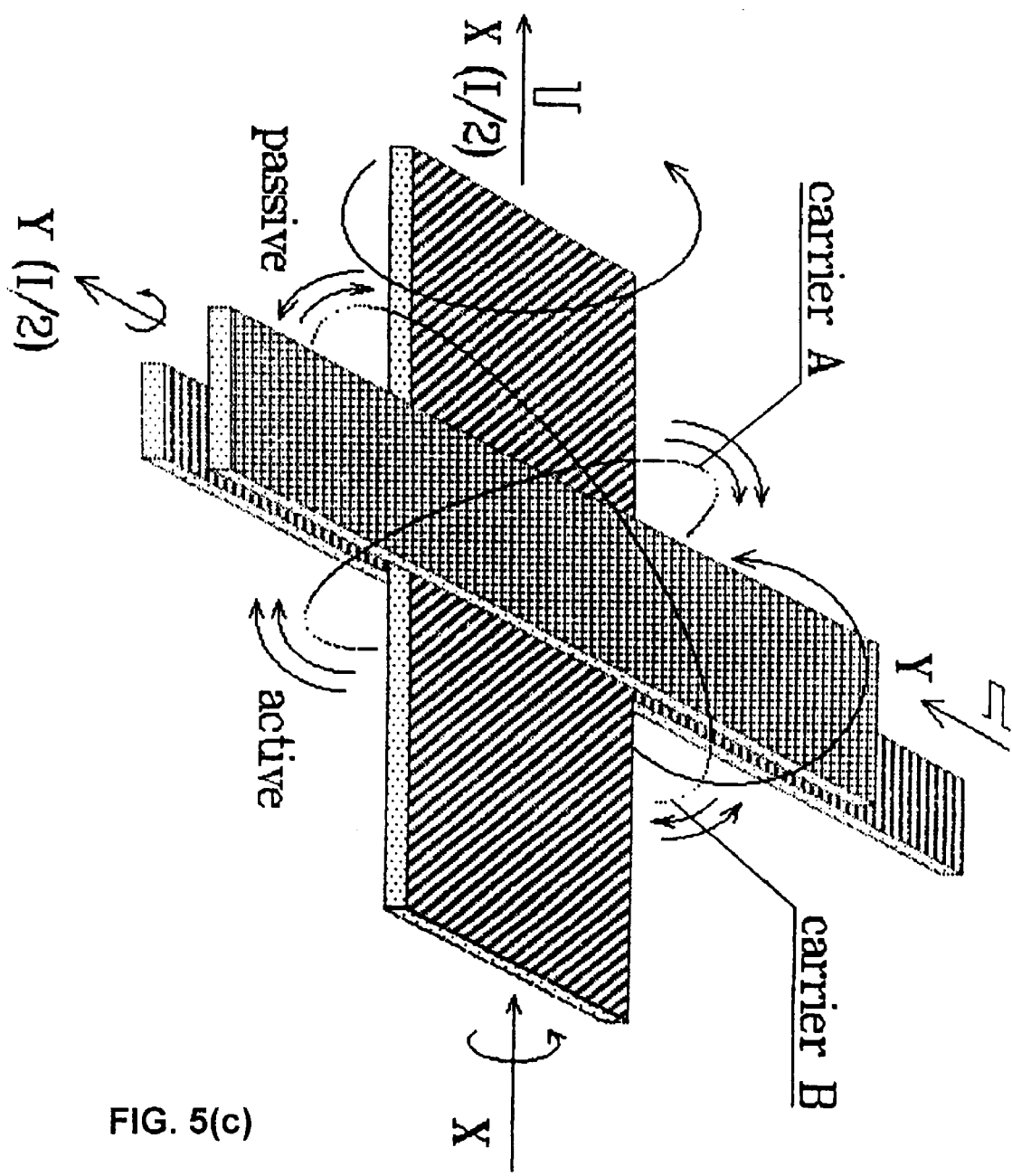

The orthogonal address lines 130,150 divide the cell into four quarters 370, 375, 380 and 385, as illustrated in FIG. 5(*a*). As discussed below, a first bit of information is magnetically stored in the quarters 370 and 380, and a second bit is magnetically stored in the quarters 375 and 385. For simplicity, the quarters 370 and 380 where a first bit of information is stored are collectively referred to as carrier "a", and the quarters 375 and 385 where a second bit is stored are collectively referred to as a carrier "b".

To store a bit of information in one of the carriers of the memory device, two electrical currents having specified amplitudes and polarities are applied to the first and second address lines 130,150. Information is retrieved from one of the carriers by applying two electrical currents to the same address lines but of opposite polarity and measurements of photo-current generated in light detectors located above and below the record carrier of the storing device.

The current applied to the first address line is represented as $I_i$, and the current applied to the second address line is represented as $I_j$. The directions of $I_i$ and $I_j$ are indicated by the arrows entering the address lines. In the preferred version, the currents $I_i$ and $I_j$ have the same amplitude, $I_0$. Each current generates an induced circular magnetic field around the address lines as illustrated by the arrows 390 and 395.

The directions of the magnetic fields $B_i$ and $B_j$ induced by $I_i$ and $I_j$ in each quarter is illustrated in FIGS. 5(*a*) and (*b*). A dot (.) indicates that the field is in the "up" direction and a cross (x) indicates that the field is in the opposite or "down" direction.

As illustrated in FIG. 5(*a*), in the quarters 385 and 375 (carrier "b") $B_i$ and $B_j$ have the opposite directions and thus cancel each other out. For this reason the currents illustrated in FIG. 5(*a*) do not affect the information stored in the carrier "b". On the other hand, in the quarters 370 and 380 (carrier "a") the fields $B_i$ and $B_j$ are induced in the same direction. Accordingly, these fields enhance each other and, thus, can alter the stored information.

Thus two currents having the same polarities and amplitudes applied to the address lines, affect only the magnetic state of the carrier "a" and thereby select this carrier. Likewise, two negative pulses also select and can store data in the carrier "a". Also note that the amplitudes of the currents that select the carrier "a" should not be equal, as long as their combined effect does not change the magnetic state in the carrier "b".

FIG. 5(*b*) illustrates the process of selecting the carrier "b". Two currents, having opposite polarities, $I_i=+I_0$ and $I_j=-I_0$, are applied to the first and second address lines respectively. As illustrated using the dot and cross convention described above, in the carrier "a", the fields generated by these currents cancel each other out, without affecting the magnetic state. In carrier "b" however the fields generated by these currents enhance each other so that the carrier "b" is selected.

Similarly, two currents $I_i=-I_0$ and $I_j=+I_0$ applied to the two address lines also select the carrier "b". Thus two currents with the same amplitude but the opposite polarities select the carrier "b" for storing or retrieving information.

To store information, the amplitudes of the two currents combined should be sufficiently large to switch the magnetization of a carrier between the magnetic states $+B_0$ and $-B_0$. In addition, the amplitudes of these two currents should be sufficiently small so that a single current alone is unable to change the magnetic state of a carrier. This is necessary to assure that only one carrier in the memory array is selected by the signal on an address line.

To retrieve information from memory, it is necessary, the same as and with the introduction of the information in memory, that the amplitudes of the two currents combined be sufficiently large to switch the magnetization of a carrier between the magnetic states $-B_0$ and $+B_0$. In addition, the amplitudes of these two currents should be sufficiently small so that a single current alone is unable to change the magnetic state of a carrier.

Let us consider the process of writing a binary "1" into the carrier "a" using synchronous current pulses on the two address lines. Initially, all the cells of the array are assumed to be in the "0" state which corresponds to a magnetic induction of $-B_0$. [In all carriers "a" ($a_0, a_1, a_2, \ldots a_n$), the zero ("0") is recorded by two synchronized currents $I_i=-I_0$ and $I_j=-I_0$; in all carriers "b" ($b_0, b_1, b_2, \ldots b_n$), the zero ("0") is recorded by two synchronized currents $I_0=-I_0$ and $I_j=+I_0$.]

To write a binary "1" into the carrier "a", two synchronized current pulses, $I_i=+2.5 \mu A$ and $I_j=+2.5 \mu A$ are applied to the two address lines, respectively. This generates a magnetic field which magnetizes the layers in the magnetic carrier "a". The magnetic induction Br of these layers is depicted in FIG. 3 as a closed loop with an arrow. For the structure having the dimensions described above, the amplitude of the critical current Ic necessary to generate the critical field strength $H_c$ required for switching between the two discrete states is approximately 4.5 $\mu A$. At the cell where the two pulses coincide, the two +2.5 $\mu A$ currents create a field $\overset{\prime}{I}$ that would be generated by applying a 5.0 $\mu A$ current. Since this current is greater than $I_c$, the magnetic induction becomes $+B_0$, so that a binary "1" is stored. As explained previously, after the pulses have ended, the magnetic induction at the cell $B_r$ remains equal to $+B_0$, so that a binary "1" is retained in the carrier "a".

To read the information stored in the carrier "a" (which is the same as recording the binary "0"), two synchronized current pulses, $I_i=-2.5 \mu A$ and $I_j=-2.5 \mu A$ are applied to the address lines respectively. Since the sum of these currents is greater than $I_c=4.5 \mu A$, the current pulses switch the magnetic state from $+B_0$ to $-B_0$.

When switching between $+B_0$ and $-B_0$, a pulse of light above the top and beneath the bottom address lines, in a layer of porous silicon, is generated. This quantum of light is detected by light detectors in electrical pulses that can be used for check whether a bit of the binary information is incorporated in the memory. If the magnetic condition does not change, the light pulse is not generated, either. As was already specified above, light pulse is generated only in the event that magnetic reversal of magnetic dipoles occurs. The termination of light generation has backlog delta t from the time of the termination of application of pulses of a current. This backlog is equal, about 0.5 ns.

The introduction and extraction of data for the carrier "b" is made in a similar way. To write a binary "1" into the carrier "b", two synchronized current pulses, $I_i=+2.5 \mu A$ and $I_j=-2.5 \mu A$ are applied to the two address lines, to place "1" in the carrier "b". As was already mentioned above, such pulses of the current do not affect the carrier "a". This generates a magnetic field which magnetizes the layers in the magnetic carrier "b". In a cell where two pulses coincide, a field is induced which is equivalent to a field induced by 5.0 $\mu A$ by the current. As it is greater than $I_c=4.5 \mu A$, binary "1" is introduced to the carrier "b". To read the information stored in the carrier "b", (that is the same as the record of binary "0"), two synchronized current pulses, $I_i=-2.5 \mu A$ and $I_j=+2.5 \mu A$ are applied to the address lines respectively.

A pulse of light above the top and beneath the bottom address lines, in a layer of porous silicon, is thus generated.

This quantum of light is detected by light detectors in electrical pulses that can be used to check whether a bit of the binary information is incorporated in the memory. If the magnetic condition does not change, the light pulse is not generated, either. As was already discussed in connection with the carrier "a", the light pulse is generated only in the event that magnetic reversal of magnetic dipoles occurs. The termination of light generation has backlog delta t from the time of the termination of application of pulses of the current. This backlog is equal to about 0.5 ns.

In the described way of extraction of information from the storing device of this invention, a method of reading with destruction of the information is applied. Therefore, in the preferred device, the circuit of rewriting of information after each cycle of reading was used.

The main advantage of the storing device of this invention is high density of information at low energy charge, and speed.

As was mentioned above, in the preferred version of the invention, a silicon crystal with the external sizes (16×8× 0.14) mm or (0.62"×0.31"×0.0055") is used, in which the whole interface is located, and is a complete non-volatile device with direct access on one category with 67,108,864 addresses (67 Mbit). In standard packing for chips the size (20×10 ×2.6) mm or (0.78"×0.39"×0.1") places completed memory on 8 categories with 134,217,728 address (1,073, 741,824 Mbit) at speed of access to any address (information update time) of 12 ns and consumed capacity at information changes in any address consisting from one word (Power consumption to access an address consisting of one word for information update) $-1.5 \times 10^{-9}$ W.

Also note that this way of optical reading of information differs in a high ratio of a useful signal to a handicap signal than at the induced electromagnetic voltage, as was the case in the previous magnetic storing devices.

Thus a memory device which is random accessible, non-volatile, and operates in static mode has been described. This memory device offers high-speed operation, low power consumption, and can store information at high density.

The claims which follow are to be interpreted to cover all the equivalent structures and methods. The invention is, thus, not to be limited by the above exemplary disclosure, but only by the following claims.

What is claimed is:

1. A non-volatile cell of a carrier of record with optical reading comprising:

a basis;

a first light detector on said basis;

a first magnetic metal two layer film with low specific electroconductivity, consisting of two layers, wherein a bottom layer is amorphous, and a top layer is polycrystalline, generated on said basis;

a first address line from non-magnetic metal with high specific electroconductivity, generated on said polycrystalline layer of said first magnetic metal two layer film;

a second magnetic metal film with low electroconductivity to an electrical current and polycrystalline structure, generated on said first address line;

a second address line, located orthogonally to said first address line and generated on said second magnetic film;

a third magnetic metal film with low specific electroconductivity, consisting of two layers, as is the first film, but with an opposite arrangement of layers, wherein a bottom layer is polycrystalline, and a top layer is amorphous, generated on said second address line;

a cover on said top layer of said third film;

a second light detector located on said cover.

2. A non-volatile cell of a carrier of record with optical reading of claim 1, wherein said basis comprises a plate made from Si monocrystalline, wherein:

orientation of a surface (100);

type of conductivity P, boron-alloyed;

specific resistance 12 Ω/cm;

concentration of oxygen$<1 \times 10^{18}$ atom/cm$^3$; and concentration of carbon$<5 \times 10^{16}$ atom/cm$^3$.

3. A non-volatile cell of a carrier of record with optical reading of claim 2, wherein said surface has a porous structure.

4. The two layer cell of claim 3 wherein the bottom layer having amorphous structure and consisting of $Ni_{(1-x-y)}Fe_xMo_y$ wherein the sizes x and y are values within the ranges of $0 \leq x \leq 1$; $0 \leq y \leq 1$;

the top layer, generated on bottom layer, having a polycrystalline structure and consisting of $Co_{(1-z-w)}Nb_zV_w$ wherein the sizes z and w are values within the ranges of $0 \leq z \leq 1$; $0 \leq w \leq 1$.

5. The two layer cell of claim 1 wherein the second magnetic film has a polycrystalline structure and consisting of $Co_{(1-j)}Nb_j$ wherein the size j is a value within the ranges of $0 \leq j \leq 1$.

6. The two layer cell of claim 4 wherein the composition of materials of the third magnetic film includes:

the bottom layer, generated on the second address lines (trunks) of the claim 1, having a polycrystalline structure and consisting of $Co_{(1-z-w)}Nb_zV_w$ wherein the sizes z and w are values within the ranges of $0 \leq z \leq 1$; $0 \leq w \leq 1$;

the top layer, generated on the bottom layer of the claim 1, having amorphous a structure and consisting of $Ni_{(1-x-y)}Fe_x Mo_y$ wherein the sizes x and y are values within the ranges of $0 \leq x \leq 1$; $0 \leq y \leq 1$.

7. The cell of claim 1 wherein the cover includes a film made from p-Si, and is generated on amorphous layer of the third film.

8. The cell of claim 7 wherein said surface has porous structure.

9. The cell of claims 4 or 6 wherein the size x is a value within the ranges $0.11 \leq x \leq 0.13$.

10. The cell of claim 9 wherein the size y is a value within the ranges $0.075 \leq y \leq 0.085$.

11. The cell of claim 10 wherein the size (1−x−y) is a value within the ranges $0.7855 \leq (1-x-y) \leq 0.815$.

12. The cell of claim 11 wherein the size z is a value within the ranges $0.145 \leq z \leq 0.155$.

13. The cell of claim 12 wherein the size w is a value within the ranges $0.095 \leq w \leq 0.105$.

14. The cell of claim 13 wherein the size (1−z−w) is a value within the ranges $0.74 \leq (1-z-w) \leq 0.76$.

15. The cell of claim 5 wherein the size j is a value within the ranges $0.18 \leq j \leq 0.21$.

16. The cell of claim 15 wherein the size (1−j) is a value within the ranges $0.79 \leq (1-j) \leq 0.82$.

17. The cell of claims 4 or 6 wherein the size x is substantially 0.12.

18. The cell of claim 17 wherein the size y is substantially 0.08.

19. The cell of claim 18 wherein the size (1−x−y) is substantially 0.8.

20. The cell of claims 4 or 6 wherein the size z is substantially 0.15.

21. The cell of claim 20 wherein the size w is substantially 0.1.

22. The cell of claim 21 wherein the size (1−z−w) is substantially 0.75.

23. The cell of claim 5 wherein the size j is substantially 0.2.

24. The cell of claim 23 wherein the size (1−j) is substantially 0.8.

25. The cell of claim 1 wherein the material of the first and second address lines consists from Al and element Ti, or together Ti and N.

26. The cell of claims 4 or 6 wherein the layers $Ni_{(1-x-y)}Fe_xMo_y$ also contain elements: Ar and N.

27. The cell of claim 5 wherein the layers $Co_{(1-j)}Nb_j$ also contain the following elements: Si, O and Ar.

28. The cell of claim 6 wherein the layers $Co_{(1-z-w)}Nb_zV_w$ also contain the following elements: Si, O and Ar.

29. The cell of claim 3 wherein the surface of a material includes an element Iodine (I).

30. The cell of claim 8 wherein the surface of a material includes an element Iodine (I).

31. The cell of claim 2 wherein the thickness is 140 mm.

32. The cell of claim 4 wherein the thickness of the bottom layer is substantially 80 nm.

33. The cell of claim 4 wherein the thickness of the top layer is substantially 0.2 mm.

34. The cell of claim 5 wherein the thickness of a layer is substantially 0.1 mm.

35. The cell of claim 6 wherein the thickness of the bottom layer is substantially 0.2 mm.

36. The cell of claim 6 wherein the thickness of the top layer is substantially 80 nm.

37. The cell of claim 7 wherein the thickness is substantially 0.2 mm.

38. The cell of claim 8 wherein surface of material thickness is substantially 0.1 mm.

39. The cell of claim 25 wherein the thickness is substantially 0.15 mm.

40. The cell of claim 39 wherein width is substantially 0.4 mm.

41. A method of manufacturing a composition of materials, having ferromagnetic and quantum-optical properties includes the following steps:
the basis, which is a plate monocrystalline Si wherein:
orientation of a surface (100);
type of conductivity P (boron-alloyed);
specific resistance 12 Ω/cm;
concentration of oxygen<$1\times10^{18}$ atom/cm$^3$;
concentration of carbon<$5\times10^{16}$ atom/cm$^3$;
thickness $1.4\times10^3$ μm, length $1.6\times10^4$ μm and width $8\times10^3$ μm;
etching of a surface of a substrate;
forming a bottom layer of the first film $Ni_{(1-x-y)}Fe_xMo_y$ on the basis wherein the sizes x and y are value within the ranges: $0\leq x\leq1$; $0\leq y\leq1$;
forming a top layer of the first film $Co_{(1-z-w)}Nb_zV_w$ on the bottom layer wherein the sizes z and w are values within the ranges: $0\leq z\leq1$; $0\leq w\leq1$;
forming a bottom address lines from Al on the top layer of the first film;
forming a second film $Co_{(1-j)}Nb_j$ on the bottom address lines wherein size j is a value within the ranges of $0\leq j\leq1$;
forming top address lines from Al on the second film;
forming a bottom layer of the third film $Co_{(1-z-w)}Nb_zV_w$ on the top address lines wherein the sizes z and w are values within the ranges:
$0\leq z\leq1$; $0\leq w\leq1$;
forming a top layer of the third film $Ni_{(1-x-y)}Fe_xMo_y$ on the bottom layer wherein the sizes x and y are values within the ranges: $0\leq x\leq1$; $0\leq y\leq1$;
forming of a cover made from p-Si on the top layer of the third film.

42. The method of claim 41 includes a stage of addition of I (iodine) into porous surface of the basis and cover.

43. The method of claim 41 includes a stage of addition of Ar and N in layers $Ni_{(1-x-y)}Fe_xMo_y$ of the first and third film.

44. The method of claim 41 includes a stage of addition Si and O into a layer $Co_{(i-j)}Nb_j$ of the second film.

45. The method of claim 41 includes a stage of addition Si and O in a layer $Co_{(1-z-w)}Nb_zV_w$ of the third film.

46. The method of claim 42 includes diffusion $I_{127}$ into emptiness of porous surface in a vacuum chamber which was evacuated to $2\times10^{-6}$ Torr, and Iodine ($I_{127}$) was than introduced to a pressure of $5\times10^{-3}$ Torr and the temperature in the vacuum chamber is 150° C. and lasts 60 seconds.

47. The method of claim 41 includes a stage deposition of the bottom layer of the first film, in a vacuum chamber which was evacuated to $2\times10^{-6}$ Torr, and Argon is under pressure of $5\times10^{-3}$ Torr and the substrate is heated up to temperature 100° C. and the Alloy $Ni_{(1-x-y)Fex}Mo_y$ sputtered for 2 minutes with capacity 200 W, forming a polycrystalline film.

48. Method of claim 47 wherein the size x is substantially 0.12.

49. Method of claim 48 wherein the size y is substantially 0.08.

50. Method of claim 49 wherein the size (1−x−y) is substantially 0.8.

51. Method of claim 50 wherein the thickness of a layer is equal 80 nm.

52. The method of claim 51 includes a stage of transformation of a polycrystalline film into amorphous, by implantation of Ions $1\times10^{14}$ $N_2+$ on square centimeter at an accelerating voltage 50 kV, where the energy of process of introduction of an ion destroys crystal communication in a surface layer of a film, creating amorphization.

53. The method of claim 52 includes a stage deposition of the top polycrystalline layer of the first film onto amorphous bottom layer in vacuum chamber which was evacuated $2\times10^{-6}$ Torr and the Argon is under pressure $5\times10^{-3}$ Torr and the substrate is heated up to temperature 100° C. with the Alloy $Co_{(1-z-w)}Nb_zV_w$ sputtered in current of 6 minutes with capacity 200 W, forming a polycrystalline film.

54. Method of claim 53 wherein the size z is substantially 0.15.

55. Method of claim 54 wherein the size w is substantially 0.1.

56. Method of claim 55 wherein the size $(1-z-w)$ is substantially 0.75.

57. Method of claim 54 wherein the thickness of a layer is substantially 0.2 μm.

58. Method the claim 41 includes a stage of deposition Al on the top layer of the first film through usual for aluminum barrier layer from Ti or TiN for reduction of an opportunity for diffusion of metal, which is deposited either by chemical vapor deposition (CVD), or reactive dispersion.

59. The method of claim 58 includes replacement Al on Au, which is put through barrier layer Ti/W.

60. Method of claim 59 wherein the thickness is equal 0.15 μm.

61. Method of claim 60 wherein width is equal 0.4 μm.

62. The method of claim 44 includes a stage of deposition of dielectric film from silicon dioxide on the first address lines (trunks), which will form by PECVD process (plasma chemical vapor deposition) from:

TEOS, $S_iH_4+O_2$(400° C.), or TEOS+$O_3$(400° C.).

63. Method of claim 62 wherein newly deposited film from silicon dioxide 15 amorphous and contains a network polyhedrons with an opened structure.

64. Method of claim 63 wherein the thickness of a film is substantially 50 nm.

65. The method of claim 64 includes a stage deposition of the second film on dioxide layer in vacuum chamber which was evacuated $2\times10^{-6}$ Torr and Argon is under pressure $5\times10^{-3}$ Torr and the substrate is heated up to temperature 100° C. and the Alloy $Co_{(1-j)}Nb_j$ sputtered in current of 4 minutes with capacity 200 W.

66. Method of claim 65 wherein the size j is substantially 0.2.

67. Method of claim 66 wherein the size (1–j) is substantially 0.8.

68. The method of claim 67 includes a stage of forming of a silicone dioxide layer on the second magnetic film for filling surface inequalities and reception of an equal and smooth surface.

69. The method of claim 68 has a stage of forming of the second address lines on dioxide to film.

70. Method of claim 69 is analogous to the process in the claim 58.

71. The method of claim 41 includes a stage of forming of the bottom layer of the third film on the top address lines.

72. Method of claim 71 is analogous to the process of formation of the top polycrystalline layer $Co_{(1-z-w)}Nb_zV_w$ of the first film, as is described in claim 53.

73. Method of claim 72 wherein the size z is substantially 0.15.

74. Method of claim 73 wherein the size w is substantially 0.1.

75. Method of claim 74 wherein the size (1–z–w) is substantially 0.75.

76. Method of claim 75 wherein the thickness of a layer is substantially 0.2 mm.

77. The method of claim 41 includes a stage of forming of the top layer of the third film on the bottom layer.

78. Method of claim 77 is analogous to the process of formation of the bottom polycrystalline layer $Ni_{(1-x-y)}Fe_xMo_y$ of the first film, as is described in claim 47.

79. Method of claim 78 wherein the size x is substantially 0.12.

80. Method of claim 79 wherein the size at is substantially 0.08.

81. Method of claim 80 wherein the size (1–x–y) is substantially 0.8.

82. Method of claim 50 wherein the thickness of a layer is equal 80 nm.

83. The method of claim 82 includes a stage of transformation of a polycrystalline film into amorphous, by implantation of Ions $1\times10^{14}$ $N_2$+ on square centimeter at an accelerating voltage 50 kV, where the energy of process of introduction of an ion destroys crystal communication in a surface layer of a film, creating amorphization.

84. The method of claim 7 includes a stage of formation of a film from p-Si.

85. Method of claim 84 wherein the thickness is 0.3 μm.

86. The method of claim 85 includes etching HF for obtaining porous structure.

87. Method of claim 86 wherein the depth is 0.2.

88. The method of claim 87 includes implantation Iodine (I).

89. Method of claim 88 is analogous to the method of claim 46.

90. The cell of claim 1 including detectors of light on a cover and bottom surface of the basis.

* * * * *